US012660520B2

(12) United States Patent
Hashigami

(10) Patent No.: US 12,660,520 B2
(45) Date of Patent: Jun. 16, 2026

(54) METHOD FOR PRODUCING LAMINATE, PRODUCING APPARATUS FOR LAMINATE, LAMINATE, AND SEMICONDUCTOR DEVICE

(71) Applicant: SHIN-ETSU CHEMICAL CO., LTD., Tokyo (JP)

(72) Inventor: Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 434 days.

(21) Appl. No.: 18/285,406

(22) PCT Filed: Mar. 30, 2022

(86) PCT No.: PCT/JP2022/015913
§ 371 (c)(1),
(2) Date: Oct. 3, 2023

(87) PCT Pub. No.: WO2022/215621
PCT Pub. Date: Oct. 13, 2022

(65) Prior Publication Data
US 2024/0177993 A1 May 30, 2024

(30) Foreign Application Priority Data
Apr. 7, 2021 (JP) ................................. 2021-065332

(51) Int. Cl.
*H10P 14/20* (2026.01)
*C23C 16/448* (2006.01)
(Continued)

(52) U.S. Cl.
CPC ...... *H10P 14/3434* (2026.01); *C23C 16/4486* (2013.01); *C23C 16/45512* (2013.01);
(Continued)

(58) Field of Classification Search
CPC .. H10P 14/3434; H10P 14/24; H10P 14/2925; H10P 14/3451; C23C 16/4486;
(Continued)

(56) References Cited

U.S. PATENT DOCUMENTS

2008/0166951 A1    7/2008 Tanikella et al.
2010/0200955 A1    8/2010 Oshima
(Continued)

FOREIGN PATENT DOCUMENTS

JP        2006-290676 A      10/2006
JP        2012-036013 A       2/2012
(Continued)

OTHER PUBLICATIONS

Sep. 3, 2024 Office Action issued in Japanese Patent Application No. 2023-512978.
(Continued)

*Primary Examiner* — Victor A Mandala
(74) *Attorney, Agent, or Firm* — Oliff PLC

(57)        ABSTRACT
A method producing a laminate with a semiconductor film that has a corundum crystal structure, includes the steps of mounting a substrate on a stage; heating the substrate, atomizing a raw material solution for film deposition, forming a gaseous mixture by mixing the atomized raw material solution for film deposition and carrier gas; and forming the film deposition by supplying the gaseous mixture to the substrate, wherein a surface roughness Ra of a contact surface with the substrate on the stage and the contact surface with the stage on the substrate is 0.5 μm or less. The method produces the laminate capable of stably forming a thick film of a corundum crystal thin film (the semiconductor film having a corundum crystal structure) with excellent crystal orientation and high quality.

15 Claims, 1 Drawing Sheet

(51) Int. Cl.
*C23C 16/455* (2006.01)
*H10P 14/24* (2026.01)

(52) U.S. Cl.
CPC .......... *H10P 14/24* (2026.01); *H10P 14/2925* (2026.01); *H10P 14/3451* (2026.01)

(58) Field of Classification Search
CPC .......... C23C 16/45512; C23C 16/0272; C23C 16/40; C23C 16/4581; C23C 16/4586; C23C 16/46; C23C 16/4481; C23C 16/4583; C30B 25/14; C30B 25/18; C30B 29/16; C30B 25/10; C30B 25/165; H01L 21/02175; H01L 21/02271; H01L 21/0242; H01L 21/0243; H01L 21/02439; H01L 21/02483; H01L 21/02488; H01L 21/02565; H01L 21/02576; H01L 21/02579; H01L 21/02581; H01L 21/0262; H01L 21/02628; H01L 21/02428
See application file for complete search history.

(56) References Cited

U.S. PATENT DOCUMENTS

| | | | | |
|---|---|---|---|---|
| 2011/0049779 | A1* | 3/2011 | Egami | .............. H01L 21/68735 29/559 |
| 2013/0119401 | A1* | 5/2013 | D'Evelyn | .......... H01L 21/0254 438/455 |
| 2014/0137800 | A1 | 5/2014 | Yasuhara et al. | |
| 2015/0279927 | A1* | 10/2015 | Hitora | ................... H10D 62/80 257/43 |
| 2015/0279944 | A1* | 10/2015 | Hitora | ................ H01L 21/0243 257/43 |
| 2018/0158721 | A1* | 6/2018 | Libbert | ............. H01L 21/02164 |
| 2020/0211919 | A1 | 7/2020 | Takahashi et al. | |
| 2021/0301419 | A1* | 9/2021 | Kubota | ................. C23C 16/303 |
| 2022/0029022 | A1 | 1/2022 | Watanabe et al. | |
| 2023/0122462 | A1* | 4/2023 | Yoshikawa | ............... C30B 7/10 428/402 |
| 2024/0250115 | A1* | 7/2024 | Watabe | ................... C30B 29/16 |

FOREIGN PATENT DOCUMENTS

| | | | | |
|---|---|---|---|---|
| JP | 2013-028480 A | | 2/2013 | |
| JP | 2014-103364 A | | 6/2014 | |
| JP | 2015-039033 A | | 2/2015 | |
| JP | 2020-107636 A | | 7/2020 | |
| JP | 2020-174153 | * | 10/2020 | ..................... 21/365 |
| JP | 2020-174153 A | | 10/2020 | |
| WO | 2014/091968 A1 | | 6/2014 | |
| WO | 2020/217564 A1 | | 10/2020 | |

OTHER PUBLICATIONS

Jun. 7, 2022 International Search Report issued in International Patent Application No. PCT/JP2022/015913.

Oct. 10, 2023 International Search Report issued in International Patent Application No. PCT/JP2022/015913.

Ghadbeigi Leila et al. "Optical Characterization of Gallium Oxide [alpha] and [beta] Polymorph Thin-Films Grown on c-Plane Sapphire", Journal of Electronic Materials, vol. 50, No. 6, pp. 2990-2998, XP037458720, 2021.

Jan. 2, 2026 extended Search Report issued in European Patent Application No. 22784605.2.

Apr. 8, 2026 Office Action issued in Taiwanese Patent Application No. 111110817.

* cited by examiner

[FIG. 1]
100
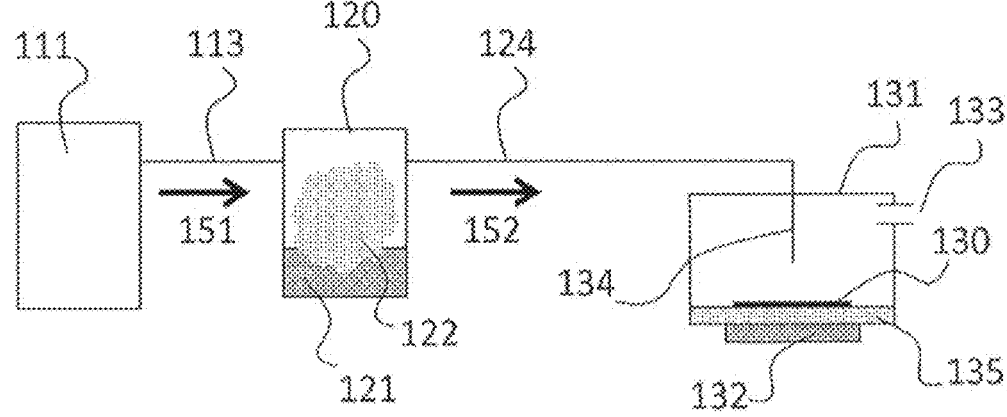
[FIG. 2]
200
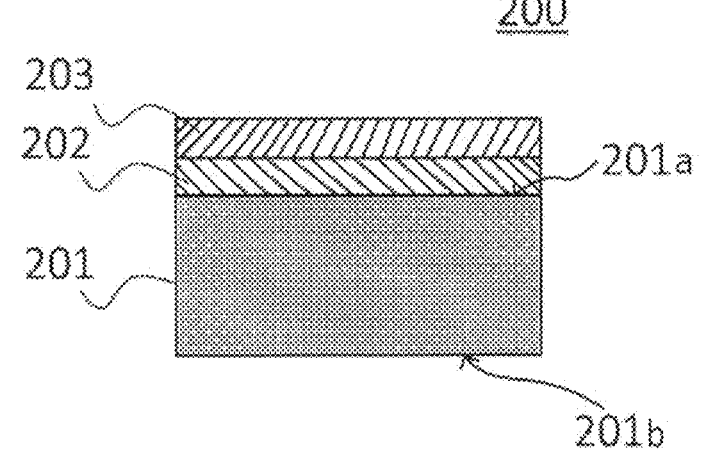
[FIG. 3]
300
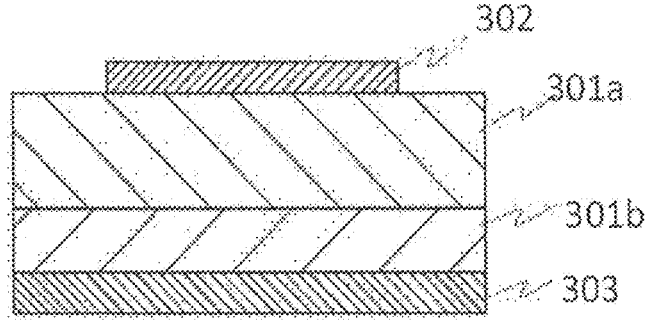

METHOD FOR PRODUCING LAMINATE, PRODUCING APPARATUS FOR LAMINATE, LAMINATE, AND SEMICONDUCTOR DEVICE

TECHNICAL FIELD

The present invention relates to a method for producing a laminate, a producing apparatus for the laminate, the laminate, and a semiconductor device.

BACKGROUND ART

A Mist Chemical Vapor Deposition (Mist CVD; hereinafter referred to as [Mist CVD method]) is known as a method that can form corundum crystal thin films with a high crystal orientation on substrates. Patent document 1 discloses a method for forming an $\alpha$-Ga$_2$O$_3$ film on a substrate in which a solution using a gallium acetylacetonate complex is atomized to the substrate installed in a narrow space (fine channel) in a reactor, then provided to a sapphire substrate. Patent document 2 discloses a method for forming an $\alpha$-Ga$_2$O$_3$ film by mounting a sapphire substrate on a hot plate installed in a film deposition chamber and supplying a raw material solution mist using gallium bromide as the raw material to the substrate from a nozzle installed above the substrate.

CITATION LIST

Patent Literature

Patent Document 1: JP2013-028480A
Patent Document 2: JP2020-107636A

SUMMARY OF INVENTION

Technical Problem

Incidentally, when using a corundum crystal thin film as a semiconductor device, a film thickness of several hundred nm or more is typically required, and even more than 1 μm when used as a power device. However, gallium oxide thin films formed by a Mist CVD method have a problem in that crystal quality deteriorates significantly as the film thickness increases. In addition, this problem is particularly noticeable at a film thickness of 1 μm or more.

The present invention is made to solve the problems described above. An object of the present invention is to provide a method for producing a laminate capable of stably forming a thick film of corundum crystal thin film (semiconductor film having a corundum crystal structure) with excellent crystal orientation and high quality. Furthermore, the object of the present invention is to provide a laminate of fine quality and suitable for manufacturing semiconductor devices.

Solution to Problem

To achieve the object described above, the present invention provides a method for producing a laminate with a semiconductor film that has a corundum crystal structure, comprising the steps of:
mounting a substrate on a stage;
heating the substrate;
atomizing a raw material solution for film deposition;

forming a gaseous mixture by mixing the atomized raw material solution for film deposition and carrier gas; and
forming the film deposition by supplying the gaseous mixture to the substrate, wherein
a surface roughness Ra of a contact surface with the substrate on the stage and a contact surface with the stage on the substrate is 0.5 μm or less.

Such method enables stable production of the laminate including the semiconductor film that has the corundum crystal structure with excellent crystal orientation and high quality even when a film thickness increases. In addition, thus damage to a transport system and a substrate carrier by a back surface of the substrate is significantly reduced, dust generation in the apparatus is suppressed and a degree of freedom of materials for the transport system and the substrate carrier is increased. Consequently, more stable, and inexpensive production of the laminate having the semiconductor film with a high-quality corundum crystal structure is enabled.

In this case, a waviness Wa of the contact surface with the substrate on the stage and the contact surface with the stage on the substrate should be 50 μm or less.

By this means, heat conduction is improved due to an increase in the contact area with the substrate, a temperature of the substrate surface does not drop significantly during film deposition due to the raw material mist for film deposition, so the crystal orientation of the semiconductor film does not deteriorate, thus stable manufacturing of a high-quality laminate is enabled.

In this case, it is preferable that the stage is heated in the step of heating the substrate.

In this manner, the temperature of the substrate can be easily maintained, thus the stable production of the high-quality laminate is enabled.

In this case, it is preferable that a thickness of the substrate is between 50 μm or more and 5000 μm or less.

Thus, the temperature of the substrate can be more easily maintained, and the formation of even thicker laminate is enabled accordingly.

In this case, it is preferable that a monocrystal substrate is used as the substrate.

Consequently, it is possible to make the laminate with higher quality.

Moreover, it is preferable that the step of mounting the substrate on the stage further includes a step of vacuum fixing the substrate on the stage, in which the vacuum degree of the vacuum is 80 kPa or less.

This means the substrate can be held and heated stably, resulting in a higher-quality laminate.

Additionally, the present invention is a producing apparatus for the laminate with a semiconductor film that has a corundum crystal structure, comprising:
a stage for mounting a substrate;
a heating means for heating the substrate;
an atomizing means for atomizing a raw material solution for film deposition; and
a gaseous mixture supplying means for supplying a gaseous mixture to the substrate by mixing the atomized raw material solution for film deposition and carrier gas, wherein
a surface roughness Ra of a contact surface with the substrate on the stage is 0.5 μm or less.

Such producing apparatus enables stable production of the laminate including the semiconductor film that has the corundum crystal structure with excellent crystal orientation and high quality even when the film thickness increases. In addition, thus damage to the transport system and the substrate carrier by the back surface of the substrate is significantly reduced, dust generation in the apparatus is suppressed and the degree of freedom of materials for the transport system and the substrate carrier is increased. Consequently, more stable, and inexpensive production of the laminate having the semiconductor film with the high-quality corundum crystal structure is enabled.

In this way, it is preferable that the waviness Wa of the contact surface with the substrate on the stage is 50 μm or less.

By this means, heat conduction is improved due to an increase in the contact area with the substrate, the temperature of the substrate surface does not drop significantly during film deposition due to the raw material mist for film deposition, so the crystal orientation of the semiconductor film does not deteriorate, thus stable manufacturing of a high-quality laminate is enabled.

Additionally, the present invention is to provide a laminate including a substrate and a semiconductor film that has a corundum crystal structure directly or through other layers on a first main surface of the substrate, in which a surface roughness Ra of a second main surface, which is the opposite side of the first main, surface of the substrate, is 0.5 μm or less.

Such laminate is the laminate having a corundum crystal structure with high quality and suitable for manufacturing a semiconductor device.

In this case, it is preferable that the thickness of the substrate is between 50 μm or more and 5000 μm or less.

Thus, the temperature of the substrate can be more easily maintained, and the formation of even thicker laminate is enabled accordingly.

In this case, it is preferable that a monocrystal substrate is used as the substrate.

This makes the laminate have higher quality.

In this case, it is preferable that the semiconductor film has a thickness of 1 μm or more.

Such laminate enables the laminate with a higher degree of freedom for a semiconductor device design.

Additionally, the present invention provides a semiconductor device including at least a semiconductor layer and an electrode, and at least a portion of the laminate as the semiconductor layer.

Consequently, a semiconductor device with high performance can be provided.

Advantageous Effects of Invention

As described above, the present invention can provide a method for producing a laminate capable of stably forming a thick film of corundum crystal thin film with high quality. Also, the present invention can provide a laminate of excellent crystal orientation and fine quality which is suitable for manufacturing semiconductor devices. In addition, the present invention can provide a semiconductor device having high performance.

BRIEF DESCRIPTION OF DRAWINGS

FIG. 1 is a view illustrating an embodiment of a film deposition apparatus for a film deposition method according to the present invention.
FIG. 2 is a view explaining an embodiment of a laminate according to the present invention.

FIG. 3 is a view explaining an embodiment of a semiconductor device according to the present invention.

DESCRIPTION OF EMBODIMENTS

As described above, a method for manufacturing a laminate capable of stably forming a thick film that includes a corundum crystal thin film with excellent crystal orientation and high quality, and the laminate of high quality and suitable for manufacturing semiconductor devices.

To solve the above problem, the present inventors have earnestly studied and found out that the problem is attributed to the low thermal conductivity of a gallium oxide-based thin film and a relatively large temperature falls on the surface of a growing film due to a film deposition by a mist CVD being performed via low-temperature droplets. Thus, the inventors find out that the laminate containing corundum crystal thin film with high crystallinity and a sufficient film thickness is yielded by the steps of mounting a substrate on a stage; heating the substrate; atomizing a raw material solution for the film deposition; forming a gaseous mixture by mixing the atomized raw material solution for the film deposition and carrier gas; and forming the film deposition by supplying the gaseous mixture to the substrate, wherein a surface roughness Ra of a contact surface with the substrate on the stage and a contact surface with the stage on the substrate is 0.5 μm or less. This finding has led to the completion of the present invention.

Namely, the present invention is a method for producing a laminate with a semiconductor film that has a corundum crystal structure, comprising the steps of: mounting a substrate on a stage; heating the substrate; atomizing a raw material solution for film deposition; forming a gaseous mixture by mixing the atomized raw material solution for film deposition and carrier gas; and forming the film deposition by supplying the gaseous mixture to the substrate, wherein a surface roughness Ra of a contact surface with the substrate on the stage and a contact surface with the stage on the substrate is 0.5 μm or less.

Furthermore, the inventors find out that a producing apparatus for the laminate with a semiconductor film that has a corundum crystal structure, comprising: a stage for mounting a substrate; a heating means for heating the substrate; an atomizing means for atomizing a raw material solution for the film deposition; and a gaseous mixture supplying means for supplying a gaseous mixture to the substrate by mixing the atomized raw material solution for the film deposition and carrier gas, wherein a surface roughness Ra of a contact surface with the substrate on the stage is 0.5 μm or less. This finding has led to the completion of the present invention.

Additionally, the inventors find out that a laminate comprising a substrate and a semiconductor film having a corundum crystal structure directly or through other layers on a first main surface of the substrate, wherein a surface roughness Ra of a second main surface, which is the opposite side of the first main surface of the substrate, is 0.5 μm or less. The inventors also find out that the laminate has fine quality and suitability for manufacturing semiconductor devices. This finding has led to the completion of the present invention.

Hereinafter, the present invention will be explained in detail. However, the present invention is not limited thereto.
Hereinafter, an explanation is given referring to the drawings.

(Laminate)

FIG. 2 is a drawing to explain an embodiment of a laminate of the present invention. A laminate 200 of the present invention comprises a substrate 201, a ground layer 202 directly formed on the substrate 201, and a crystal layer 203 having a corundum structure. The substrate 201 has a first main surface 201*a*, which in the opposite side of a second main surface 201*b*, and a surface roughness Ra of the second main surface is 0.5 μm or less. A crystalline layer 203 corresponds to a semiconductor film of the laminate of the present invention.

The substrate 201 has the first main surface and a second main surface opposite the first main surface and is not limited to any particular substrate as long as it can hold the film to be formed, additionally, may be similar to a substrate 130 in FIG. 1, described later. A monocrystal substrate is especially preferable.

The shape of substrate 201 can be any shape that has the first main surface and the second main surface opposite to the first main surface, for example, plates such as a flat plate and a disk, a rod, a column, a prism, a tube, a ring, but a plate shape is preferred. In this present invention, the surface roughness Ra of the second main surface (also referred to as a back surface), which is the opposite side of the first main surface of the substrate with a layer formed, is 0.5 μm or less. Additionally, it is more preferable that a waviness Warp (hereafter described as Wa) is 50 μm or less. The smaller the surface roughness Ra is the better, and the lower limit is not particularly limited but can be 0.1 nm or more, for example. The surface roughness Ra may be measured with a measurement length of 10 μm or more, for example, at one or more freely selected places on the main surfaces. The smaller waviness Wa is preferably the better, the lower limit is not particularly limited, for example, but can be 0.5 μm or more. The waviness Wa may be measured on one or more freely-selected strait lines on an appropriately determined main surface according to the shape of the substrate 201. For example, for a 10 cm diameter disc-shaped substrate, the measurement length can be any length on two straight lines that intersect at right angles at the center of the substrate. Further, the surface roughness Ra and the waviness Wa are values calculated based on JIS B 0601 using results of surface shape measurement by the tracer method, atomic force microscope (AFM) method, or non-contact measurement method using laser microscope or confocal microscopes such as optical interferometry, confocal method, and image synthesis method by focal shift. Things like this can process the laminate with high quality by light irradiation from the second main surface of the substrate, and the design freedom of semiconductor devices will be increased. In addition, as described later, by the film deposition combined with a stage having a smooth substrate mounting surface, it is possible to produce a laminate with a high-quality semiconductor film with excellent crystal orientation even when the laminate is thickly film-deposited. Such smoothness of the substrate surface is easily obtained, for example, in the case of sapphire, the surface of the substrate, which is obtained by processing the crystal, is processed by lapping with diamond abrasive grain, then followed by further mirror finishing by chemical-mechanical polishing (CMP) with colloidal silica.

Additionally, the substrate, which having the semiconductor film formation surface which is the first main surface with an area of 5 cm$^2$ or more, preferably 10 cm$^2$ or more, and a thickness of 50 μm or more to 5000 μm or less, preferably 100 μm or more to 2000 μm or less, can be used suitably. When the thickness is 50 μm or more, supporting the semiconductor film is easier, and when the thickness is 5000 μm or less, not only substrate cost reduction but also increases the number of pieces processed per batch during the semiconductor device manufacturing process improves productivity.

The crystalline layer 203 is a semiconductor film having the corundum crystal structure but not limited thereto. A corundum crystal is a metal oxide crystal, which may contain such as Al, It, V, Cr, Fe, Co, Ni, Ga, Rh, In, and Ir as its chief elements. Additionally, the crystalline layer 203 may be polycrystalline, but it is preferable to be monocrystal. The composition of the crystalline layer 203 is preferably such that the atomic ratio of the sum of gallium, indium, aluminum and iron in the metal elements in this thin film is 0.5 or more, and the atomic ratio of gallium in the metal elements is 0.5 or more. In addition to this, a film thickness of 1 μm or more is also desirable because it makes the film more suitable for semiconductor devices. The upper limit of the film thickness is not particularly limited but can be 20 μm or less, for example. The layer thickness of each laminate layer can be made to any film thickness by adjusting the film deposition time.

Additionally, the crystalline layer 203 may contain dopant elements. The dopants are not particularly limited to n-type dopants such as tin, silicon, germanium, titanium, zirconium, vanadium, or niobium, or p-type dopants such as copper, silver, cobalt, iridium, rhodium, magnesium, and nickel. A dopant concentration is adjusted appropriately by the design of the target semiconductor device but may be, for example, $1\times10^{16}$/cm$^3$ to $1\times10^{22}$/cm$^3$.

A ground layer 202 may be such a semiconductor film having a corundum structure with a different composition other than the crystalline layer 203, a crystal thin layer other than the corundum structure, and an amorphous thin film.

The ground layer 202 can also be used as a stress relief layer to relieve lattice mismatch and thermal stress between the substrate 201 and the crystalline layer 203, or as a sacrificing layer to exfoliate the crystalline layer 203 from the substrate 201 in a later process, depending on the purpose. As a stress relief layer, for example, when an α-Ga$_2$O$_3$ film is formed on an Al$_2$O$_3$ substrate, (Al$_x$Ga$_{1-x}$)$_2$O$_3$ (0≤x≤1) should be formed as the ground layer (the stress relief layer) 202, and the x value should be decreased from the substrate 201 side to the crystalline layer 203 side. Additionally, as the sacrificing layer, a material with a band gap smaller than that of the crystalline layer 203 is suitable. Furthermore, the material having soluble characteristics to solutions such as water, acids, alkalis, or alcohols, or ketones is suitable. Such materials may contain crystalline films or amorphous films containing such as Si, V, Cr, Fe, Co, Ni, Zn, Ge, Rh, In, Sn and Ir; and Fe$_2$O$_3$, Co$_2$O$_3$, N$_2$O$_3$, Rh$_2$O$_3$, In$_2$O$_3$, Ir$_2$O$_3$ or their mixed crystals are more preferred. In addition, the ground layer 202 may or may not contain the dopant.

Although FIG. 2 shows an example in which each of the ground layer 202 and the crystalline layer 203 is formed on the substrate 201, the present invention is not limited to this example, thus either or both ground layer 202 and the crystalline layer 203 may be formed in multiple layers. In addition, the crystalline layer 203 may form on the substrate 201 directly without forming the ground layer 202. Although not shown in the drawing, a crystalline or an amorphous conductor layer or an insulator layer may be further stacked on the crystalline layer 203.

In the laminate of the present invention, the semiconductor film or the laminate including the semiconductor film may be exfoliated from the substrate. The exfoliating method is not limited and may be any publicly known method. Exfoliation methods include such as a method to exfoliate by applying mechanical shock, a method to exfoliate by heating for thermal stress, a method to exfoliate by applying oscillation of ultrasonic vibrations, a method to exfoliate by etching, a method to exfoliate by using the change of state of the film due to light absorption. The film thus exfoliated can also be used as a self-supported film when it has enough film thickness.

(Semiconductor Device)

A semiconductor device of the present invention includes at least a semiconductor layer and an electrode, and at least a portion of the laminate as the semiconductor layer.

A semiconductor film in a laminate of the present invention has a good crystal orientation, an excellent electric characteristic, useful on an industrial scale. Such laminate can be used for such as semiconductor devices suitably and is particularly useful for power devices. In addition, the semiconductor film formed as a part of the laminate may be used in an intact state (a state as the laminate) or may be applied to, for example, the semiconductor device after the exfoliation from the substrate by the known method.

Additionally, semiconductor devices can be categorized into horizontal elements in which electrodes are formed on one surface side of the semiconductor layer (horizontal devices), and vertical elements with electrodes on both the front and rear surface sides of the semiconductor layer (vertical devices). At least some of the laminates of the present invention can be suitably used for both horizontal devices and vertical devices. In particular, at least some of the laminates of the present invention are preferred for use in vertical devices.

The semiconductor devices include such as Schottky-barrier diode (SBD), metal-semiconductor field effect transistor (MESFET), high electron mobility transistor (HEMT), metal oxide semiconductor field effect transistor (MOS-FET), junction field-effect transistor (JFET), insulated gate type bipolar transistor (IGBT) or light-emitting diode (LED).

In addition, in the semiconductor device using the laminate of the present invention, other layers (e.g., an insulator layer or a conductor layer) may be included further, depending on a specification and a purpose, and the ground layer may be added or omitted appropriately.

A suitable example of the semiconductor device using the laminate of the present invention is shown in FIG. 3. FIG. 3 shows an example of a Schottky-barrier diode (SBD) The Schottky-barrier diode (SBD) 300 has an n⁻ type semiconductor layer 301a with a relatively low doping concentration, an n⁺ type semiconductor layer 301b with a relatively high doping concentration, a Schottky electrode 302, and an ohmic electrode 303. Among these, the n⁻ type semiconductor layer 301a and the n⁺ type semiconductor layer 301b are a partial use of the laminate of the present invention.

The materials of the Schottky electrode 302 and the ohmic electrode 303 may be known electrode materials, and such electrode materials include, for example, metals such as aluminum, molybdenum, cobalt, zirconium, tin, niobium, iron, chromium, tantalum, titanium, gold, platinum, vanadium, manganese, nickel, copper, hafnium, tungsten, iridium, zinc, indium, palladium, neodymium, or silver, or their alloys; conductive metal-oxide thin films such as silver oxide, tin oxide, zinc oxide, rhenium oxide, indium oxide, indium tin oxide (ITO), indium zinc oxide (IZO); organic electroconductive compounds such as polyaniline, polythiophene or polypyrrole, or mixtures thereof, and laminate.

The formation of the Schottky electrode 302 and the ohmic electrode 303 is achieved by known methods such as a vacuum evaporation method or a sputtering technique. More specifically, when the Schottky electrode is formed using, for example, two types of metals from the above metals, a first metal and a second metal. Then, the electrode can be formed by laminating a layer made of the first metal and a layer made of the second metal and then patterning using photolithography techniques on the layer made of the first metal and the layer made of the second metal.

When a reverse bias is applied to the Schottky-barrier diode (SBD) 300, a depletion layer (not shown) spreads into the n⁻ type semiconductor layer 301a, resulting in a high-voltage SBD. When a forward bias is applied, electrons flow from the ohmic electrode 303 to the Schottky electrode 302. Consequently, the SBD of the present invention is excellent for high-voltage and large-current applications and has fast switching speed, excellent voltage resistance, and reliability.

(Film Deposition Apparatus)

Hereinafter, an explanation is given referring to the drawings.

FIG. 1 is a drawing to explain an embodiment of a configuration for a film deposition apparatus suitable for producing a laminate of the present invention.

A film deposition apparatus 100 suitable for producing the laminate of the present invention composes at least a raw material container 120 forming raw material mist 122 for film deposition by atomizing a raw material solution 121 for film deposition, a film deposition chamber 131 for forming a film on substrate 130 by providing raw material mist 122 for film deposition to substrate 130, a stage 135 for mounting the substrate 130, and a heating method 132 for heating the stage 135. A film deposition apparatus 100 also has a carrier gas supply unit 111. The carrier gas supply unit 111, the raw material container 120, and the film deposition chamber 131 are connected by pipes 113 and 124. Carrier gas 151 and raw material mist 122 for film deposition are mixed in material container 120 to form a gaseous mixture 152, which is supplied to the film deposition chamber 131.

The material solution 121 for film deposition is not limited when it can be misted and can be made by dissolving or dispersing metals in organic solvents or water in the form of complexes or salts. The metals are not limited, when those metals can form corundum structures as metal oxide crystals, such metals include Al, Ti, V, Cr, Fe, Co, Ni, Ga, Rh, In, and Ir. The salt forms include halide salts, such as metal chloride salts, metal bromide salts, and metal iodide salts. The above metals can also be used as salt solutions dissolved in hydrogen halides such as hydrochloric acid, hydrobromic acid, and hydroiodic acid. Forms of complexes include, for example, acetylacetonate complex, carbonyl complex, ammine complex, and hydride complex. Acetylacetonato complex can also be formed by mixing the above salt solution with acetylacetone.

The content of the metals in a raw material solution for the film deposition is not particularly limited to and adjustable based on the purpose. Preferably, the content of the metals should be between 0.001 mol/L or more and 2 mol/L or less, and more preferably 0.01 mol/L or more and 0.7 mol/L or less.

Additionally, the raw material solution for film deposition may include the dopant. The dopant is not particularly limited to n-type dopants such as tin, silicon, germanium, titanium, zirconium, vanadium, or niobium, or p-type dopants such as copper, silver, cobalt, iridium, rhodium, magnesium, nickel.

The atomizing method of the raw material solution 121 for film deposition is not particularly limited when the raw material solution 121 for film deposition can be atomized or made into droplets. Although any known means may be used, the atomization method using ultrasonic waves is preferred in the present invention. The mist or droplet obtained using the ultrasonic waves are desirable because they have zero initial velocity and float in the air and are very suitable because they are not damaged by collision energy, for example, because they are a mist that can be conducted as a gas floating in the air rather than being sprayed. The droplet size is not limited, and may be as small as a few millimeters, but is preferably 50 μm or less, and more preferably 0.1 μm or more to 10 μm or less.

Moreover, the raw material container 120 may have a plural chamber depending on the materials and so forth to be film deposited. In this case, the gaseous mixture 152 supplied from a plural raw material container 120 to the film deposition chamber 131 may be supplied independently to the film deposition chamber 131 or may be mixed in the pipe 124 or in a separate mixing container (not shown).

The raw material container 120 may further equip thermo-control means (not shown) to adjust the temperature of the raw material solution 121 for film deposition directly or indirectly. The temperature of the raw material solution 121 for film deposition is not limited when atomizing is possible, preferably, the temperature is between 10° C. to 90° C., more preferably, 20° C. to 50° C. Consequently, a temperature falls of the substrate 130 on a film-forming surface is relaxed and better film deposition is enabled. On the other hand, when the temperature exceeds 90° C., the vaporization of the raw material mist 122 for film deposition is facilitated and a yield in film deposition is decreased, and defects are introduced on the surface of the film.

The carrier gas supply unit 111 supplies carrier gas 151. The type of carrier gas 151 is not particularly limited and in addition to inert gases such as nitrogen and argon, air, oxygen, ozone, or reducing gases such as hydrogen or forming gas can be used, or a mixture of several of these gases can be used. The flow rate of carrier gas can also be set according to the substrate size and the size of the film deposition chamber, for example, from 0.01 L/min or more to 100 L/min or less.

Additionally, the carrier gas supply unit 111 may be an air compression unit, gas tank of any kind, nitrogen gas separator, or may have a system to control the gas supply flow rate.

The pipes 113 and 124 are not particularly limited when the pipes have adequate stability to the raw material solution 121 for the film deposition and the temperature inside and outside of the film deposition chamber 131. In addition to quartz, a wide range of common resins such as polyethylene, polypropylene, vinyl chloride, silicone resin, urethane resin, and fluoropolymer can be used for materials of the pipes.

Furthermore, although not shown in drawings, it is possible to connect separately a pipe to pipe 124 from the carrier gas supply unit 111 without connecting to the raw material container 120, further adding diluent gas to the gaseous mixture 152. A ratio of raw material mist 122 for film deposition and carrier gas 151 is adjustable. The flow rate of the diluent gas can be set appropriately, such as 0.1 to 10 times per minute of carrier gas. The diluent gas should be supplied downstream of the raw material, container 120. The diluent gas can be the same as carrier gas 151 or different gas.

In the film deposition chamber 131, a supply pipe 134 is connected to the pipe 124 and installed to supply the gaseous mixture 152 into the film deposition chamber 131. The supply pipe 134 can be a tube made of quartz, glass, or resin for example. An exhaust part 133 of exhaust gas can be installed at a position that does not affect the mist supply from the supply pipe 134.

A structure and a material of the film deposition chamber 131 are not particularly limited, and metals such as aluminum and stainless steel can be used, or quartz, silicon carbide, or glass can be used when film deposition is performed at higher temperatures.

The stage 135 is installed on the bottom of the film deposition chamber 131 and the substrate 130 is mounted on the stage 135. The substrate 130 is heated by heating the stage 135 which has a heating method 132. The heating of the substrate 130 is adjusted appropriately according to the raw material mist 122 for film deposition and a film deposition condition used, but can typically be in the range of 120° C. to 600° C.

A material for the stage 135 can be selected appropriately according to raw materials used for film deposition or processing conditions such as a heating temperature. For example, stainless steel, hastelloy, brass, copper, and graphite, as well as ceramics such as silicon carbide, alumina, and aluminum nitride are suitably used. Also, the heating method 132 can be applied by publicly known methods, and resistance heating, electromagnetic induction heating, and lamp heating are suitably used. Additionally, to improve heat conduction to the substrate 130, the surface roughness Ra is 0.5 μm or less on a substrate mounting surface on the stage 135. Moreover, it is further preferable that the waviness Wa is 50 μm or less. The smaller surface roughness Ra is preferably the better, and the lower limit is not particularly limited but can be 0.1 nm or more, for example. When Ra exceeds 0.5 μm, the contact area with substrate 130 decreases, which worsens heat conduction, and the temperature of the substrate surface drops significantly during film deposition by raw material mist for film deposition. Consequently, the crystal orientation of the semiconductor film is degraded. The surface roughness Ra may be measured at one or more freely-selected locations on the mounting surface with a measurement length of, for example, 20 μm or more. The smaller waviness Wa is preferably the better, the lower limit is not particularly limited but can be 0.5 μm or more. When Wa is 50 μm or less, the contact area with the substrate 130 widens, then heat conduction improves, thus the temperature drop of the substrate surface is less significant during film deposition by raw material mist for film deposition. Consequently, the crystal orientation of the semiconductor film is not degraded. The waviness Wa may be measured on one of the more freely selected straight lines on the mounting surface predetermined appropriately according to the shape of the mounting surface. For example, when the mounting surface has a circular shape, the diameter of the circle can be defined as a measured length on two straight lines intersecting at right angles at the center of the circle. The surface roughness Ra and the waviness Wa are values calculated according to JIS B 0601 using surface shape measurement results from non-contact measurement methods using a laser microscope or confocal microscope, such as a tracer method, an atomic force microscope (AFM) method, an optical interferometry, confocal method, and an image synthesis method using focal shift.

The stage 135 may be further equipped with a substrate fixing structure, which is not shown in the drawings. In this case, any known substrate fixing structure such as a vacuum chuck, electro-static chuck, or mechanical clamp can be suitably used, but preferably a vacuum chuck should be used. Further, the degree of the vacuum should be 80 kPa or less to hold and heat the substrate stably. The lower the degree of the vacuum, the better, but on the other hand, a vacuum pump becomes larger, so the degree of the vacuum can be set to 1 kPa or higher from a cost standpoint.

(Producing Apparatus for Laminate)

The present invention is a producing apparatus for a laminate with a semiconductor film that has a corundum crystal structure, comprising:

a stage for mounting a substrate;

a heating means for heating the substrate;

an atomizing means for atomizing a raw material solution for film deposition; and a gaseous mixture supplying means for supplying a gaseous mixture to the substrate by mixing the atomized raw material solution for film deposition and carrier gas, wherein a surface roughness Ra of a contact surface with the substrate on the stage is 0.5 µm or less.

In the present invention, it is preferable that a waviness Wa of the contact surface with the substrate on the stage is 50 µm or less. The waviness Wa is preferably the smaller the better, the lower limit is not particularly limited but can be 0.5 µm or more for example. When Wa is 50 µm or less, the contact area with the substrate 130 widens, then heat conduction improves, thus the temperature drop of the substrate surface is less significant during film deposition by raw material mist for film deposition. Consequently, the crystal orientation of the semiconductor film is not degraded. The waviness Wa may be measured on ore of the more freely selected straight lines on the mounting surface predetermined appropriately according to the shape of the mounting surface. For example, when the mounting surface has a circular shape, the diameter of the circle can be defined as a measured length on two straight lines intersecting at right angles at the center of the circle.

(Method for Producing Laminate)

The present invention is a method for producing a laminate with a semiconductor film that has a corundum crystal structure, comprising the steps of:

mounting a substrate on a stage;

heating the substrate;

atomizing a raw material solution for film deposition;

forming a gaseous mixture by mixing the atomized raw material solution for film deposition and carrier gas; and forming the film deposition by supplying the gaseous mixture to the substrate, wherein a surface roughness Ra of a contact surface with the substrate on the stage and a contact surface with the stage on the substrate is 0.5 µm or less.

In this present invention, a substrate forming a semiconductor layer is used which has a surface roughness Ra of a second main surface (also referred to as a back surface), which is the opposite side of the first main surface, is 0.5 µm or less. The second main surface is a surface where the substrate 130 comes into contact with the mounting surface of the stage 135, when surface roughness Ra of the second main surface exceeds 0.5 µm, the contact area with a substrate mounting surface of the stage 135 decreases, which worsens heat conduction. Consequently, the temperature of the substrate surface drops significantly during film deposition by raw material mist, and then the crystal orientation of the semiconductor film is degraded. The shape of substrate 130 can be any shape that has a first main surface and a second main surface opposite to the first main surface, for example, plates such as flat plates and disks, a rod, a column, a prism, a tube, a ring, but a plate shape is preferred.

The substrate 130 is not limited as long as it can support, the semiconductor film to be formed. The material of the substrate 130 is also not limited and may be any known material, and may be an organic compound or an inorganic compound. For example, polysulfone, polyethersulfone, polyphenylene sulphide, polyether ether ketone, polyimide, polyetherimide, fluororesin, metals such as iron, aluminum, stainless steel, and gold, quartz, glass, calcium carbonate, gallium oxide, ZnO are exemplified, especially, monocrystal substrates are preferable, and monocrystal substrates of GaN, SiC, lithium tantalate, lithium niobate, silicon, sapphire, and α-type gallium oxide are preferred because it is easier to obtain laminates with excellent crystal orientation.

Additionally, a substrate having an area of a formation surface on a semiconductor film of 5 cm$^2$ or more, preferably, 10 cm$^2$ or more, and a thickness of 50 µm or more to 5000 µm or less, preferably, 100 µm or more µm to 2000 µm or less can be used suitably. A thickness of 50 µm or more can hold the semiconductor film with ease. When a thickness is 5000 µm or less, the temperature drop of the surface of the substrate by raw material mist for film deposition is not significant, thus crystal orientation of the semiconductor film is not degraded.

In light of improving heat conduction to the substrate 130, the surface roughness Ra is 0.5 µm or less on a substrate mounting surface of the stage 135. Moreover, it is further preferable that the waviness Wa is 50 µm or less. The smaller surface roughness Ra is preferably the better, and the lower limit is not particularly limited but can be 0.1 nm or more, for example. When Ra exceeds 0.5 µm, the contact area with substrate 130 decreases, which worsens heat conduction. Consequently, the temperature of the substrate surface drops significantly during film deposition by raw material mist for film deposition, and then the crystal orientation of the semiconductor film is degraded. The surface roughness Ra may be measured at one or more freely-selected locations on the mounting surface with a measurement length of, for example, 20 µm or more. The smaller waviness Wa is preferably the better, the lower limit is not particularly limited but can be 0.5 µm or more, for example. When Wa is 50 µm or less, the contact area with the substrate 130 widens, then heat conduction improves, thus the temperature drop of the substrate surface is less significant during film deposition by raw material mist for film deposition. Consequently, the crystal orientation of the semiconductor film is not degraded. The waviness Wa may be measured on one of the more freely selected straight lines on the mounting surface predetermined appropriately according to the shape of the mounting surface. For example, when the mounting surface has a circular shape, the diameter of the circle can be defined as a measured length on two straight lines intersecting at right angles at the center of the circle. The surface roughness Ra and the waviness Wa are values calculated according to JIS B 0601 using surface shape measurement results from non-contact measurement methods using a laser microscope or confocal microscope, such as a tracer method, an atomic force microscope (AFM) method, an optical interferometry, confocal method, and an image synthesis method using focal shift. By combining such stage and the substrate having the surface roughness Ra of 0.5 µm or less on the second main surface as described above, a high-quality laminate with excellent crystalline orientation can be obtained even when a thick film deposition is performed. In this instance, the film thickness of the semiconductor film should be 1 µm or more.

In a step to mount the substrate on the stage, a method to mount the substrate on the stage is not particularly limited and a publicly known method can be used. In addition, the stage 135 may further equip a substrate fixing mechanism which is not shown in drawings. In this case, any known substrate fixing structure such as a vacuum chuck, electrostatic chuck, or mechanical clamp can be suitably used, but preferably a vacuum chuck should be used. Further, the degree of the vacuum should be 80 kPa or less to hold and heat the substrate stably. The lower the degree of the vacuum the better, but on the other hand, this makes a vacuum pump much larger, so the degree of the vacuum can be set to 1 kPa or higher from a cost standpoint.

In the step of heating the substrate, the heating method is not particularly limited, and a publicly known method can be used, but heating the stage is particularly preferable. The heating temperature is not particularly limited.

In the step of atomizing the raw material solution for film deposition, a method for atomizing the raw material solution for film deposition is not particularly limited, and a publicly known method, preferably, a method using ultrasonic waves can be used. The raw material solution for film deposition is not limited as long as it can be atomized, and a metal dissolved or dispersed in organic solvent or water in the form of a complex or salt can be used.

In a step of forming a gaseous mixture by mixing the atomized raw material solution for film deposition and carrier gas, a method for forming a gaseous mixture by mixing the atomized raw material solution for film deposition and carrier gas is not limited and a publicly known method can be used. The type of carrier gas is not particularly limited and in addition to inert gases such as nitrogen and argon, air, oxygen, ozone, or reducing gases such as hydrogen and forming gas can be used, or a mixture of several of these gases can be used.

In the step of providing the gaseous mixture to the substrate for film deposition, a method for providing the gaseous mixture to the substrate, or a method for performing film deposition are not particularly limited and can be used as a publicly known method.

Such laminate producing method can provide the method to produce the laminate that can form a thick film of the semiconductor film with a corundum crystal structure of high quality and excellent crystal orientation.

(Producing System for Laminate)

The present invention is a producing system for the laminate with the semiconductor film that has a corundum crystal structure, comprising mechanisms of:

mounting a substrate;

heating the substrate;

atomizing a raw material solution for film deposition;

forming a gaseous mixture by mixing the atomized raw material solution for film deposition and carrier gas; and supplying the gaseous mixture to the substrate to perform film deposition, wherein a surface roughness Ra of a contact surface with the substrate on the stage and a contact surface with the stage on the substrate is 0.5 μm or less.

In this present invention, a substrate forming a semiconductor layer is used which has a surface roughness Ra of a second main surface (also referred to as a back surface), which is the opposite side of the first main surface, is 0.5 μm or less. The second main surface is a surface where the substrate 130 comes into contact with the mounting surface of the stage 135, when surface roughness Ra of the second main surface exceeds 0.5 μm, the contact area with a substrate mounting surface of the stage 135 decreases, which worsens heat conduction, and the temperature of the substrate surface drops significantly during film deposition by raw material mist. Consequently, the crystal orientation of the semiconductor film is degraded. The shape of substrate 130 can be any shape that has a first main surface and a second main surface that is opposite to the first main surface, for example, plates such as flat plates and disks, a rod, a column, a prism, a tube, a ring, but a plate shape is preferred.

The substrate 130 is not limited as long as it can support the semiconductor film to be formed. The material of the substrate 130 is also not limited and may be any known material, and may be an organic compound or an inorganic compound. For example, polysulfone, polyethersulfone, polyphenylene sulphide, polyether ether ketone, polyimide, polyetherimide, fluororesin, metals such as iron, aluminum, stainless steel, and gold, quartz, glass, calcium carbonate, gallium oxide, ZnO are exemplified, especially, monocrystal substrates are preferable, and monocrystal substrates of GaN, SiC, lithium tantalate, lithium niobate, silicon, sapphire, and α-type gallium oxide are preferred because it is easier to obtain laminates with excellent crystal orientation.

Additionally, a substrate having an area of semiconductor film formation surface of 5 cm$^2$ or more, preferably, 10 cm$^2$ or more, and a thickness of 50 μm or more or 5000 μm or less, preferably, 100 μm or more or 2000 μm or less can be used suitably. A thickness of 50 μm or more can hold the semiconductor film with ease. When the thickness is 5000 μm or less, the temperature drop of the surface of the substrate by raw material mist for film deposition is not significant, thus crystal orientation of the semiconductor film is not degraded.

In light of improving heat conduction to the substrate 130, the surface roughness Ra is 0.5 μm or less on a substrate mounting surface on the stage 135. Moreover, it is further preferable that the waviness Wa is 50 μm or less. The smaller surface roughness Ra is preferably the better, and the lower limit is not particularly limited but can be 0.1 nm or more, for example. When Ra exceeds 0.5 μm, the contact area with substrate 130 decreases, which worsens heat conduction, and the temperature of the substrate surface drops significantly during film deposition by raw material mist for film deposition. Consequently, the crystal orientation of the semiconductor film is degraded. The surface roughness Ra may be measured at one or more freely-selected locations on the mounting surface with a measurement length of, for example, 20 μm or more. The smaller waviness Wa is preferably the better, the lower limit is not particularly limited but can be 0.5 μm or more. When Wa is 50 μm or less, the contact area with the substrate 130 widens, then heat conduction improves, thus the temperature drop of the substrate surface is less significant during film deposition by raw material mist for film deposition. Consequently, the crystal orientation of the semiconductor film is not degraded. The waviness Wa may be measured on one of the more freely selected straight lines on the mounting surface predetermined appropriately according to the shape of the mounting surface. For example, when the mounting surface has a circular shape, the diameter of the circle can be defined as a measured length on two straight lines intersecting at right angles at the center of the circle. The surface roughness Ra and the waviness Wa are values calculated according to JIS B 0601 using surface shape measurement results from non-contact measurement methods using a laser microscope or confocal microscope, such as a tracer method, an atomic force microscope (AFM) method, an optical interferometry, confocal method, and an image synthesis method using focal shift. By combining such stage and the substrate having the surface roughness Ra of 0.5 µm or less on the second main surface as described above, a high-quality laminate with excellent crystalline orientation can be obtained even when a thick film deposition is performed. In this instance, the film thickness of the semiconductor film should be 1 µm or more.

In a mechanism to mount the substrate on the stage, a method to mount the substrate on the stage is not particularly limited and a publicly known method can be used. In addition, the stage 135 may further equip a substrate fixing mechanism which is not shown in drawings. In this case, any known substrate fixing mechanism such as a vacuum chuck, electro-static chuck, or mechanical clamp can be suitably used, but preferably a vacuum chuck should be used. Further, the degree of the vacuum should be 80 kPa or less to hold and heat the substrate stably. The lower the degree of the vacuum, the better, but on the other hand, this makes a vacuum pump larger, so the degree of the vacuum can be set to 1 kPa or higher from a cost standpoint.

In the mechanism of heating the substrate, the heating method is not particularly limited, and a publicly known method can be used, but heating the stage is particularly preferable. The heating temperature is not particularly limited.

In the mechanism atomizing the raw material solution for film deposition, the method for atomizing the raw material solution for film deposition is not particularly limited, and a publicly known method, preferably, a method using ultrasonic waves can be used. The raw material solution for film deposition is not limited as long as it can be atomized, and a metal dissolved or dispersed in organic solvent or water in the form of a complex or salt can be used.

In a mechanism of forming a gaseous mixture by mixing the atomized raw material solution for film deposition and carrier gas, a method for forming the gaseous mixture by mixing the atomized raw material solution for film deposition and carrier gas is not limited and a publicly known method can be used.

The type of carrier gas is not particularly limited and in addition to inert gases such as nitrogen and argon, air, oxygen, ozone, or reducing gases such as hydrogen and forming gas can be used, or a mixture of several of these gases can be used.

In the mechanism of providing the gaseous mixture to the substrate for film deposition, a method for providing the gaseous mixture to the substrate, or a method for performing film deposition are not particularly limited and can be used as a publicly known method.

Such laminate producing method can provide the method to produce the laminate that can form the thick film of the semiconductor film with a corundum crystal structure of high quality and excellent crystal orientation.

Example

Hereinafter, the present invention will be specifically described with reference to Examples and Comparative Examples. However, the present invention is not limited thereto.

Example 1

Film deposition of α-gallium oxide was performed using a film deposition apparatus shown in FIG. 1. For atomizing means for film deposition an atomizer having a raw material container made of quarts, and two ultrasonic vibrators (frequency of 2.4 MHz) was used. A film deposition chamber was made of quartz and equipped with a quartz feed supply pipe and a silicon carbide hot plate as a stage. A surface roughness Ra was 0.05 µm, and a waviness Wa was 4.3 µm on a substrate mounting surface on a stage. In addition, a gas cylinder filled with nitrogen gas was used for supplying carrier gas. The gas cylinder and the atomizer for film deposition were connected by a urethane resin tube, then the atomizer for film deposition and the supply tube was connected by a quart pipe.

Moreover, gallium acetylacetonate was mixed in a solution of pure water with 34% hydrochloric acid of 1% by volume at a ratio of 0.1 mol/L and stirred for 60 minutes with a stirrer to dissolve to make a raw material solution for film deposition.

Furthermore, the raw material solution for film deposition was filled into the raw material container and then an ultrasonic vibrator was used to atomize (mist) the raw material solution for film deposition by propagating ultrasonic vibrations to the raw material solution for film deposition in the raw material container through an ultrasonic wave propagating water. In addition, the temperature of the ultrasonic wave propagating water was adjusted and the temperature of the raw material solution for film deposition was maintained at 35° C.

Then, a c-surface sapphire substrate (substrate) having a diameter of 10 cm (4 inches), a thickness of 0.6 mm, a surface roughness Ra of 0.05 µm of back surface, and a waviness Wa of 1.9 µm of back surface was mounted on a mounting surface of a stage, then fixed by decompression to 20 kPa using a vacuum pump. Subsequently, the stage was heated so that the temperature of the surface on the state reached 500° C.

Next, nitrogen gas was added to the raw material container at a flow rate of 5 L/min, and a gaseous mixture of mist and nitrogen gas was supplied to the film deposition chamber for 30 minutes for film deposition. Right after this, the supply of nitrogen gas was disconnected, and the supply of the gaseous mixture to the film deposition chamber was disconnected.

A crystalline layer of the produced laminate was confirmed to be α-Ga$_2$O$_3$ by X-ray diffraction measurement.

Then, a half-width was further evaluated by measuring the rocking curve of X-ray diffraction. The film thickness of the crystalline layer was also measured by polarimetry.

Example 2

The film deposition was performed in the same way as in Example 1, except that the substrate mounting surface on the stage had a surface roughness Ra of 0.45 µm, and the surface roughness Ra of the substrate back rear surface was 0.41 µm.

The crystalline layer of the produced laminate was confirmed to be α-Ga$_2$O$_3$ by X-ray diffraction measurement.

Then, a half-width and a film thickness of the crystalline layer were evaluated in the same way as in Example 1.

Example 3

Film deposition was performed in the same way as in Example 2, except that the gaseous mixture was supplied to the film deposition chamber for 150 minutes.

The crystalline layer of the produced laminate was confirmed to be α-Ga$_2$O$_3$ by X-ray diffraction measurement.

Then, a half-width and a film thickness of the crystalline layer were evaluated as in Example 1.

Example 4

Film deposition was performed in the same way as in Example 1, except that the degree of the vacuum for substrate fixing was set to 75 kPa.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Comparative Example 1

Film deposition was performed in the same way as in Example 1, except that a surface roughness Ra on a substrate mounting surface on the stage was 0.60 μm.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Comparative Example 2

Film deposition was performed in the same way as in Example 1, except that a surface roughness Ra on a substrate back surface was 0.62 μm.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Comparative Example 3

Film deposition was performed in the same way as in Example 1, except that a surface roughness Ra on a substrate back surface was 0.62 μm, and the gaseous mixture supply time for the film deposition chamber was 150 min.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Comparative Example 4

Film deposition was performed in the same way as in Example 1, except that a surface roughness Ra on a substrate back surface was 0.62 μm, and the degree of the vacuum for fixing the substrate was 95 kPa.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Example 5

Film deposition was performed in the same way as in Example 1, except that the waviness Wa on the substrate back surface was 45.8 μm.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Example 6

Film deposition was performed in the same way as in Example 1, except that the waviness Wa on the mounting surface of the stage was 48.2 μm.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Example 7

Film deposition was performed in the same way as in Example 1, except that the waviness Wa on the substrate back surface was 47.7 μm and the waviness Wa on the mounting surface of the stage was 48.2 μm.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Example 8

Film deposition was performed in the same way as in Example 1, except that the waviness Wa on the mounting surface of the stage was 59.7 μm.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

Example 9

Film deposition was performed in the same way as in Example 1, except that the waviness Wa on the substrate back surface was 52.1 μm.

The crystalline layer of the produced laminate was confirmed to be $\alpha$-Ga$_2$O$_3$ by X-ray diffraction measurement.

Then, a half-width and a film thickness of the crystalline layer were evaluated as in Example 1.

The film thicknesses and rocking curve half-widths of the crystalline layers obtained in Examples 1 to 9, and Comparative Examples 1 to 4 are shown in Table 1.

TABLE 1

| | The mounting surface of the stage | | The back surface of the substrate | | Vacuum chuck Degree of vacuum | Crystal layer thickness | Half-width |
|---|---|---|---|---|---|---|---|
| | Ra [μm] | Wa [μm] | Ra [μm] | Wa [μm] | [kPa] | [μm] | [second] |
| Example 1 | 0.05 | 4.3 | 0.05 | 1.9 | 20 | 1.25 | 10.5 |
| Example 2 | 0.45 | 4.3 | 0.41 | 2.2 | 20 | 1.23 | 14.3 |
| Example 3 | 0.45 | 4.5 | 0.41 | 2.1 | 20 | 5.75 | 13.1 |
| Example 4 | 0.05 | 4.4 | 0.05 | 1.9 | 75 | 1.20 | 11.0 |
| Comparative Example 1 | 0.60 | 4.3 | 0.05 | 1.8 | 20 | 1.41 | 137 |

TABLE 1-continued

| | The mounting surface of the stage | | The back surface of the substrate | | Vacuum chuck Degree of vacuum | Crystal layer thickness | Half-width |
|---|---|---|---|---|---|---|---|
| | Ra [μm] | Wa [μm] | Ra [μm] | Wa [μm] | [kPa] | [μm] | [second] |
| Comparative Example 2 | 0.05 | 4.4 | 0.62 | 2.2 | 20 | 1.39 | 122 |
| Comparative Example 3 | 0.05 | 4.4 | 0.62 | 2.0 | 20 | 6.60 | 256 |
| Comparative Example 4 | 0.05 | 4.5 | 0.62 | 2.0 | 95 | 1.77 | 308 |
| Example 5 | 0.05 | 4.5 | 0.05 | 45.8 | 20 | 1.23 | 11.8 |
| Example 6 | 0.05 | 48.2 | 0.05 | 2.1 | 20 | 1.22 | 12.5 |
| Example 7 | 0.05 | 48.2 | 0.05 | 47.7 | 20 | 1.28 | 15.1 |
| Example 8 | 0.05 | 59.7 | 0.05 | 2.3 | 20 | 1.52 | 28.8 |
| Example 9 | 0.05 | 4.5 | 0.05 | 52.1 | 20 | 1.43 | 32.4 |

Table 1 indicates that the film deposition apparatus pertaining to the method for producing the laminate of the present invention is excellent in producing high-quality crystalline layers (semiconductor films) with both film thickness exceeding 1 μm and low half-width (high crystal orientation), as shown in Examples 1 to 9. On the other hand, in Comparative Examples 1 to 4, where the surface roughness Ra of either the stage mounting surface or the substrate back surface was greater than 0.5 μm, a tendency was observed that the half-width increased and the growth rate also increased (crystal orientation decreased). This is considered a result of abnormal film growth due to the temperature fall on the film surface.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for producing a laminate with a semiconductor film that has a corundum crystal structure, comprising the steps of:
   mounting a substrate on a stage;
   heating the substrate;
   atomizing a raw material solution for film deposition;
   forming a gaseous mixture by mixing the atomized raw material solution for film deposition and carrier gas; and
   forming the film deposition by supplying the gaseous mixture to the substrate, wherein
   a surface roughness Ra of a contact surface with the substrate on the stage and a contact surface with the stage on the substrate is 0.5 μm or less.

2. The method for producing the laminate according to claim 1, wherein a waviness Wa of the contact surface with the substrate on the stage and the contact surface with the stage on the substrate is 50 μm or less.

3. The method for producing the laminate according to claim 1, wherein the stage is heated in the step of heating the substrate.

4. The method for producing the laminate according to claim 2, wherein the stage is heated in the step of heating the substrate.

5. The method for producing the laminate according to claim 1, wherein a substrate with a thickness of 50 μm or more and 5000 μm or less is used as the substrate.

6. The method for producing the laminate according to claim 1, wherein a monocrystal substrate is used as the substrate.

7. The method for producing the laminate according to claim 1, wherein the step of mounting the substrate on the stage further includes a step of vacuum fixing the substrate on the stage, in which the vacuum of a degree of the vacuum is 80 kPa or less.

8. A producing apparatus for the laminate with a semiconductor film that has a corundum crystal structure, comprising:
   a stage for mounting a substrate;
   a heating means for heating the substrate;
   an atomizing means for atomizing a raw material solution for film deposition; and
   a gaseous mixture supplying means for supplying a gaseous mixture to the substrate by mixing the atomized raw material solution for film deposition and carrier gas, wherein
   a surface roughness Ra of a contact surface with the substrate on the stage is 0.5 μm or less.

9. A producing apparatus for the laminate according to claim 8, wherein a waviness Wa of the contact surface with the substrate on the stage is 50 μm or less.

10. A laminate comprising a substrate and a semiconductor film having a corundum crystal structure directly or through other layers on a first main surface of the substrate, wherein a surface roughness Ra of a second main surface, which is the opposite side of the first main surface of the substrate, is 0.5 μm or less.

11. The laminate according to claim 10, wherein a thickness of the substrate is between 50 μm or more and 5000 μm or less.

12. The laminate according to claim 10, wherein the substrate is a monocrystal substrate.

13. The laminate according to claim 11, wherein the substrate is a monocrystal substrate.

14. The laminate according to claim 10, wherein the semiconductor film has a thickness of 1 μm or more.

15. A semiconductor device includes at least a semiconductor layer and an electrode, and at least a portion of the laminate, according to claim 10, as the semiconductor layer.

* * * * *